United States Patent

Ooms et al.

[11] Patent Number: 5,973,379
[45] Date of Patent: Oct. 26, 1999

[54] FERROELECTRIC SEMICONDUCTOR DEVICE

[75] Inventors: William J. Ooms, Chandler; Jerald A. Hallmark, Gilbert, both of Ariz.

[73] Assignee: Motorola, Inc., Schaumburg, Ill.

[21] Appl. No.: 09/080,480

[22] Filed: May 18, 1998

Related U.S. Application Data

[62] Division of application No. 08/743,761, Nov. 7, 1996, Pat. No. 5,851,844.

[51] Int. Cl.$^6$ .................................................. H01L 29/792
[52] U.S. Cl. ............................................ 257/410; 257/295
[58] Field of Search .................................. 257/410, 411, 257/295

[56] References Cited

U.S. PATENT DOCUMENTS

| | | | |
|---|---|---|---|
| 3,808,674 | 5/1974 | Francombe et al. | 29/590 |
| 5,146,299 | 9/1992 | Lampe et al. | 357/23.5 |
| 5,361,225 | 11/1994 | Ozawa | 365/145 |
| 5,424,238 | 6/1995 | Sameshima | 437/52 |
| 5,723,885 | 3/1998 | Ooishi | 257/410 |
| 5,767,543 | 6/1998 | Ooms et al. | 257/316 |
| 5,846,847 | 12/1998 | Ooms et al. | 438/3 |

*Primary Examiner*—David B. Hardy
*Attorney, Agent, or Firm*—Robert D. Atkins; Lanny L. Parker; William E. Koch

[57] ABSTRACT

A ferroelectric semiconductor device (10) and a method of manufacturing the ferroelectric semiconductor device (10). The ferroelectric semiconductor device (10) has a layer (15) of ferroelectric material disposed on a semiconductor substrate (11) and a gate structure (27) formed on the semiconductor substrate (11). A source region (23) and a drain region (24) are formed on the semiconductor substrate such that the source region (23) and the drain region (24) are laterally spaced apart from the gate structure (27).

11 Claims, 2 Drawing Sheets

FERROELECTRIC SEMICONDUCTOR DEVICE

CROSS-REFERENCE TO RELATED APPLICATION

This is a divisional of applicant's prior application Ser. No. 08/743,761, filed Nov. 7, 1996, U.S. Pat. No. 5,851,844, issued Dec. 22, 1998.

BACKGROUND OF THE INVENTION

The present invention relates, in general, to semiconductor devices, and more particularly, to ferroelectric semiconductor devices.

Ferroelectric materials have been used to form electrical components such as non-volatile memories, capacitors, and optical guided wave devices. For example, in non-volatile semiconductor devices a ferroelectric material is deposited on a substrate oxide overlying a semiconductor substrate. Then, a gate material is deposited on the ferroelectric material. The gate material and the ferroelectric material are etched to form a gate structure. Source/drain regions are formed by implanting an impurity material into the semiconductor substrate, wherein the source/drain regions are self-aligned to the gate structure.

A drawback in the manufacture of ferroelectric semiconductor devices having self-aligned source/drain regions is that these regions may extend under the gate structure. The extension of the source/drain regions under the gate structure increases the capacitance of the ferroelectric semiconductor device, thereby degrading its frequency performance.

Additionally, the implantation of the source/drain region requires a high temperature anneal for the activation of the implant. This high temperature anneal is detrimental to the ferroelectric material.

Accordingly, it would be advantageous to have a ferroelectric device and a method for manufacturing the ferroelectric device that eliminates the need for the implanted source/drain region.

DETAILED DESCRIPTION OF THE DRAWINGS

Generally, the present invention provides a ferroelectric device and a method for manufacturing the ferroelectric device that does not use a self-aligned implant to form the source and drain regions. In accordance with one aspect of the present invention a depletion mode ferroelectric device having two different threshold voltages is manufactured. In another aspect of the present invention, the ferroelectric device has two threshold voltages and is an enhancement mode ferroelectric transistor when operated at a first of the two threshold voltages and a depletion mode ferroelectric transistor when operated at a second of the two threshold voltages.

Further, the channel regions of the ferroelectric devices of the present invention are intrinsically aligned to the gate structure.

Figure 1:
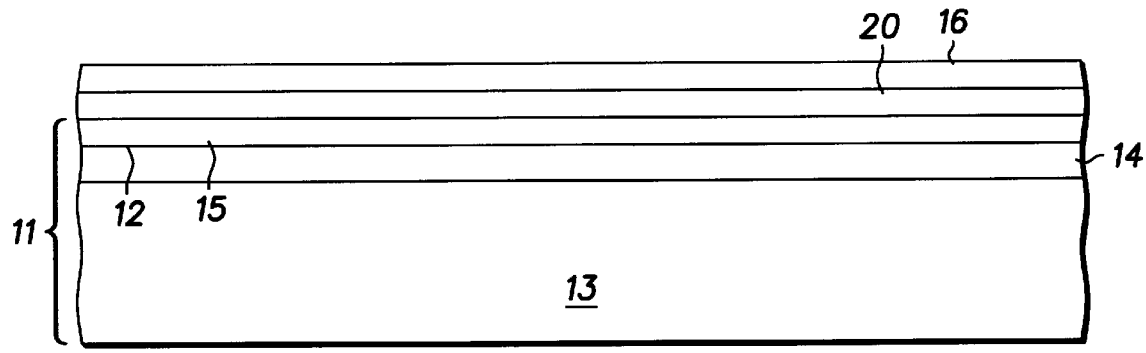
FIG. 1 is a cross-sectional view of a portion of a ferroelectric semiconductor device at an early stage of manufacture in accordance with a first embodiment of the present invention.

FIG. 1 is a cross-sectional view of a portion of a ferroelectric semiconductor device 10 at an early stage of manufacture in accordance with the present invention. Ferroelectric semiconductor device 10 includes a semiconductor material 11 having a major surface 12 with a layer 15 of ferroelectric material formed thereon. In accordance with one example, semiconductor material 11 is comprised of a substrate material 13 of, for example, P conductivity type having a layer 14 of semiconductor material of N conductivity type formed thereon. In accordance with another example, semiconductor material 11 is comprised of a substrate material 13 of, for example, N conductivity type having a layer 14 of semiconductor material of P conductivity type formed thereon. Layer 14 can be an epitaxially grown layer of semiconductor material or formed using ion implantation. Suitable semiconductor materials for semiconductor material 11 include silicon, various epitaxial layers on silicon, silicon-on-insulator, silicon-on-ferroelectric material, gallium arsenide, indium phosphide, or the like. Suitable materials for ferroelectric layer 15 include barium titanate ($BaTiO_3$) and other perovskites, as well as layered bismuth ferroelectrics such as bismuth titanate ($Bi_4Ti_3O_{12}$) and bismuth strontium tantalate ($SrBi_2Ta_2O_9$), and other ferrelectrics such as yttrium manganate ($YMnO_3$), or the like.

By way of example, semiconductor substrate 11 is silicon having a <001> surface orientation and ferroelectric layer 15 is epitaxially formed on semiconductor substrate 11. Epitaxial films of ferroelectric material may be formed using an ultra high vacuum deposition system such as, for example, molecular beam epitaxy or chemical beam epitaxy, or a low pressure metallo-organic chemical vapor deposition system.

The use of an ultra high vacuum deposition system is a means of preventing undesired elements from destroying the electronic properties at the interface between silicon substrate 11 and ferroelectric layer 15. In accordance with a first embodiment of the present invention, a monocrystalline layer of ferroelectric material is formed in intimate contact with the semiconductor substrate. Further, ferroelectric layer 15 has a lattice constant substantially matching that of semiconductor substrate 11. The method of the present invention prevents undesired material such as, for example, an undesired oxide or contaminants from appearing at the interface between semiconductor substrate 11 and ferroelectric layer 15. Although epitaxial formation of the ferroelectric material is advantageous, it should be understood that the method of forming the layer of ferroelectric material is not a limitation of the present invention. It should be further understood that ferroelectric layer 15 may be comprised of a combination of a dielectric material such as silicon dioxide or silicon nitride and a ferroelectric material.

Still referring to FIG. 1, a layer 20 of conductive material is formed on ferroelectric layer 15. By way of example, conductive layer 20 is polysilicon. A layer 16 of photoresist is formed on conductive layer 20. Techniques for forming layers of conductive material and photoresist are known to those skilled in the art.

Figure 2:
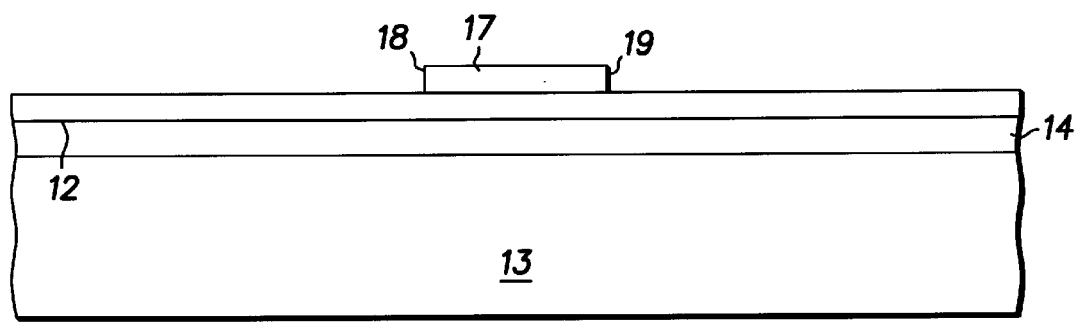
FIG. 2 is a cross-sectional view of the semiconductor device of FIG. 1 further along in processing.

FIG. 2 is a cross-sectional view of ferroelectric semiconductor device 10 further along in processing. It should be noted that the same reference numbers are used in the figures to denote the same elements. Photoresist layer 16 FIG. 1 is patterned to expose portions of conductive layer 20, i.e., photoresist layer 16 forms an etch mask. A gate electrode 17 having edges or sides 18 and 19 is formed by removing the portions of conductive layer 20 unprotected by the etch mask. By way of example, gate electrode 17 is formed using a reactive ion etch (RIE). Gate electrode 17 is comprised of the remaining portion of the conductive layer 20. The remaining portions of layer 16 are removed.

Figure 3:
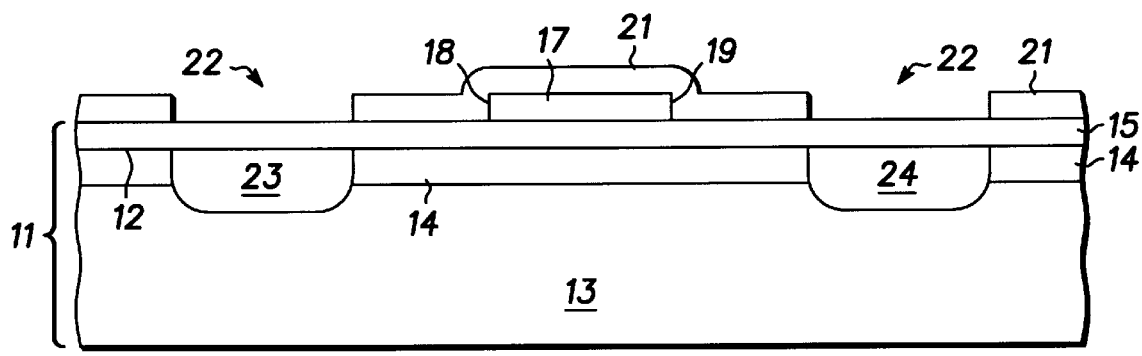
FIG. 3 is a cross-sectional view of the semiconductor device of FIG. 2 further along in processing.

Now referring to FIG. 3, an implant mask 21 is formed on ferroelectric layer 15. By way of example, implant mask 21 is photoresist patterned to have openings 22 that expose portions of ferroelectric layer 15. The exposed portions of ferroelectric layer 15 are spaced apart from edges 18 and 19.

An impurity material is implanted through openings 22 and into the portions of silicon substrate 11 underlying openings 22 to form doped regions 23 and 24. Doped regions 23 and 24 serve as source and drain regions, respectively, of ferroelectric semiconductor device 10. Preferably, the edge of source region 23 proximal to edge 18 is laterally spaced apart from edge 18 by no more than 500 nanometers. Likewise, the edge of drain regions 24 proximal to edge 19 is laterally spaced apart from edge 19 by at most 500 nanometers. In one example, silicon substrate material 13 is of P conductivity type, layer 14 is of N conductivity type, and the impurity material of doped regions 23 and 24 is of N conductivity type. In yet another example, silicon substrate 13 is of N conductivity type, layer 14 is of P conductivity type, and the impurity material of doped regions 23 and 24 is of P conductivity type. Implant mask 21 is removed using techniques known to those skilled in the art.

Figure 4:
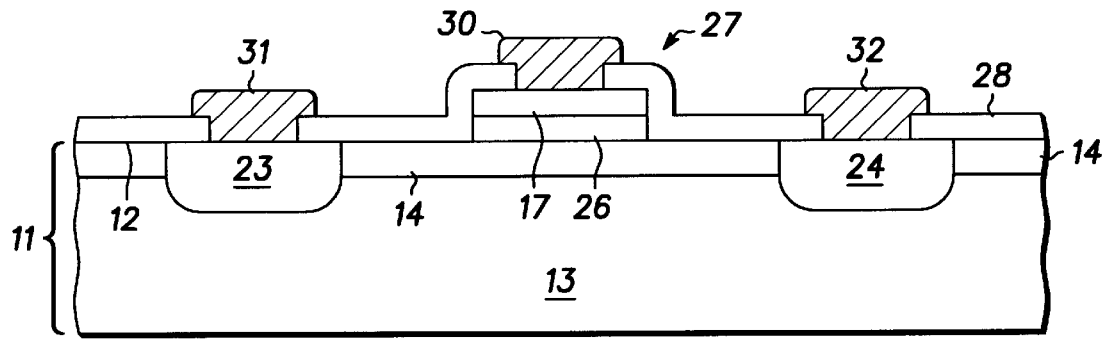
FIG. 4 is a cross-sectional view of the semiconductor device of FIG. 3 further along in processing.

Now referring to FIG. 4, ferroelectric layer 15 is anisotropically etched to remove the exposed portions of ferroelectric layer 15. In embodiments where layer 14 is a combination of dielectric material and ferroelectric material, the dielectric material may be removed as well. The portion 26 of ferroelectric layer 15 between major surface 12 and gate electrode 17 remains and serves as a ferroelectric gate dielectric material. Thus, portion 26 of ferroelectric layer 15 and gate electrode 17 cooperate to form a gate structure 27.

A layer 28 of dielectric material is formed on major surface 12 and gate structure 27. By way of example, dielectric layer 28 is an oxide layer. Openings (not shown) are formed in oxide layer 28 to expose gate structure 27 and the portions of major surface 12 adjacent doped regions 23 and 24. Gate, source, and drain contacts 30, 31, and 32, respectively, are formed to contact the exposed portions of gate structure 27 and major surface 12. Preferably, contacts 31 and 32 are ohmic contacts.

Figure 5:
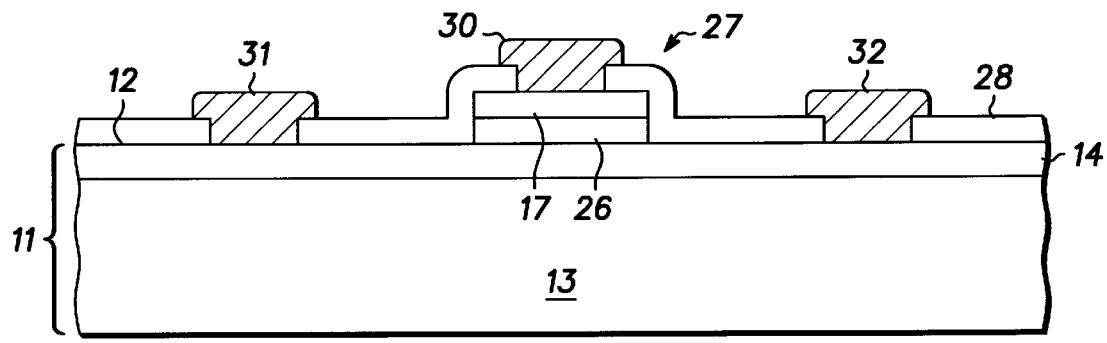
FIG. 5 is a cross-sectional view of a portion of a ferroelectric semiconductor device in accordance with a second embodiment of the present invention.

Now referring to FIG. 5, a second embodiment of a ferroelectric semiconductor device 35 is shown. It should be noted that the same reference numbers are used in the figures to denote the same elements. The difference between ferroelectric semiconductor device 10 and ferroelectric semiconductor device 35 is the absence of source and drain regions 23 and 24, respectively. In other words, the formation of ferroelectric semiconductor device 35 does not include the steps of forming implant protect mask 21 and forming doped regions 23 and 24 as described with reference to semiconductor device 10. Thus, ferroelectric semiconductor device 35 is comprised of a semiconductor substrate 11 having a ferroelectric gate structure 27 formed thereon. Gate, source, and drain contacts 30, 31, and 32, respectively, contact the respective portions of gate structure 27 and major surface 12.

Figure 6:
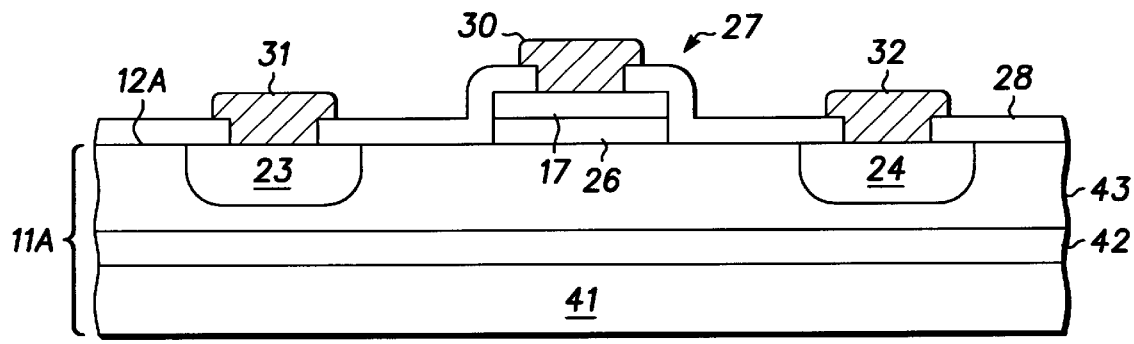
FIG. 6 is a cross-sectional view of a portion of a ferroelectric semiconductor device in accordance with a third embodiment of the present invention.

Now referring to FIG. 6, a third embodiment of a ferroelectric semiconductor device 40 is shown. It should be noted that the same reference numbers are used in the figures to denote the same elements. The difference between ferroelectric semiconductor device 10 and ferroelectric semiconductor device 40 is that the substrate material of ferroelectric semiconductor device 40 is a semiconductor-on-insulator substrate 11A having a major surface 12A. By way of example, semiconductor-on-insulator substrate 11A is comprised of an insulating layer 42 sandwiched between a silicon layer 41 and a silicon layer 43. The letter "A" has been appended to the reference numbers 11 and 12 to indicate that silicon-on-insulator substrate 11A having major surface 12A corresponds to substrate 11 having major surface 12. In other words, the structures formed on substrate 11A are the same as those formed on silicon substrate 11 (FIGS. 1–4). Thus, ferroelectric semiconductor device 40 is comprised of a semiconductor substrate 11A having a ferroelectric gate structure 27 formed thereon. Source and drain regions 23 and 24, respectively, are formed in substrate 11A such that they are not self-aligned to the gate structure. Thus, the source and drain regions 23 and 24, respectively, are spaced apart from gate structure 27. Gate contact 30 contacts gate structure 27, source contact 31 contacts source region 23, and drain contact 32 contacts drain region 24. In similar fashion to device 55, device 40 could be made without implants.

Figure 7:
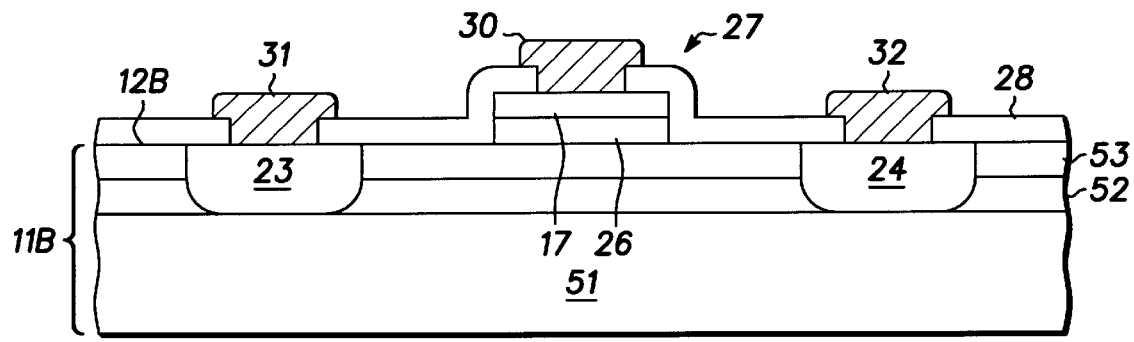
FIG. 7 is a cross-sectional view of a portion of a ferroelectric semiconductor device in accordance with a fourth embodiment of the present invention.

Now referring to FIG. 7, a fourth embodiment of a ferroelectric semiconductor device 50 is shown. It should be noted that the same reference numbers are used in the figures to denote the same elements. The difference between ferroelectric semiconductor device 10 and ferroelectric semiconductor device 50 is that the substrate material of ferroelectric semiconductor device 50 is a semiconductor-on-ferroelectric substrate 11B having a major surface 12B. By way of example, semiconductor-on-ferroelectric substrate 11B is comprised of a layer of ferroelectric material 52 sandwiched between a silicon layer 51 and a silicon layer 53. The letter "B" has been appended to the reference numbers 11 and 12 to indicate that semiconductor-on-ferroelectric substrate 11B having major surface 12B corresponds to substrate 11 having major surface 12. In other words, the structures formed on semiconductor-on-ferroelectric substrate 11B are the same as those formed on silicon substrate 11 (FIGS. 1–4). Thus, ferroelectric semiconductor device 50 is comprised of a semiconductor substrate 11B having a ferroelectric gate structure 27 formed thereon. Source and drain regions 23 and 24, respectively, are formed in substrate 11B such that they are not self-aligned to the gate structure. Thus, the source and drain regions 23 and 24, respectively, are spaced apart from gate structure 27. Gate contact 30 contacts gate structure 27, source contact 31 contacts source region 23, and drain contact 32 contacts drain region 24.

In operation, the remnant polarization in ferroelectric gate structure 27 either enhances or depletes semiconductor layer 14 (see FIG. 5), 43 (FIG. 6), or 53 (FIG. 7) in the region immediately below gate structure 27. This enhancement or depletion respectively increases or descreases the threshold voltage of ferroelectric semiconductor devices 35, 40, or 50. If semiconductor layer 14, 43, or 53 is heavily doped, respective ferroelectric semiconductor devices 35, 40, or 50 will be a depletion mode device having two threshold voltages. If semiconductor layer 14, 43, or 53 is more lightly doped, then the remnant polarization in ferroelectric gate structure 27 can invert the polarity of semiconductor layer 14, 43, or 53. Thus, the device is an enhancement mode device when operated at a first of two threshold voltages and a depletion mode device when operated at the second of the two threshold voltages.

By now it should be appreciated that a ferroelectric transistor and a method for forming the ferroelectric transistor have been provided. The ferroelectric transistor is comprised of a semiconductor material having a ferroelectric gate structure formed thereon. The source/drain regions are spaced apart from the gate structure thereby preventing the source/drain regions from extending under the ferroelectric gate structure and increasing the device capacitance. An advantage of the method and structure of the present invention is that the channel region is self-aligned to the ferroelectric gate structure, whereas the source/drain regions are not self-aligned to the ferroelectric gate structure. Thus, the present invention permits manufacturing small geometry semiconductor devices.

While specific embodiments of the invention have been shown and described, further modifications and improvements will occur to those skilled in the art. It is understood that this invention is not limited to the particular forms shown and it is intended for the appended claims to cover all modifications of the invention which fall within the true spirit and scope of the invention.

We claim:

1. A ferroelectric semiconductor device, comprising:

a semiconductor material of a first conductivity type;

a ferroelectric material over the semiconductor material, the ferroelectric material having first and second edges;

a conductive material over the ferroelectric material; and first and second doped regions of a second conductivity type formed in the semiconductor material and located on opposing sides of the conductive material, where the first doped region is spaced apart from the first edge of the ferroelectric material and the second doped region is spaced apart from the second edge of the ferroelectric material.

2. The ferroelectric semiconductor device of claim 1, wherein the ferroelectric material is bismuth titanate.

3. The ferroelectric semiconductor device of claim 1, wherein the semiconductor material is silicon.

4. The ferroelectric semiconductor device of claim 1, wherein the ferroelectric material has ions located therein.

5. A ferroelectric semiconductor device, comprising:

a semiconductor substrate having an insulating layer sandwiched between first and second layers of a semiconductor material;

a ferroelectric material formed over the first layer of the semiconductor material, the ferroelectric material having first and second edges;

a conductive material formed over the ferroelectric material; and first and second doped regions of a second conductivity type formed in the first layer of the semiconductor material and located on opposing sides of the ferroelectric material, where the first doped region is spaced apart from the first edge of the ferroelectric material and the second doped region is spaced apart from the second edge of the ferroelectric material.

6. The ferroelectric semiconductor device of claim 5, wherein the first and second layers of the semiconductor material are silicon.

7. A ferroelectric semiconductor device, comprising:

a semiconductor substrate having a first semiconductor material formed over a second semiconductor material;

a ferroelectric material over the first semiconductor material, the ferroelectric material having first and second edges;

a conductive material over the ferroelectric material; and a first contact spaced apart from the first edge of the ferroelectric material and providing contact to the first semiconductor material; and a second contact spaced apart from the second edge of the ferroelectric material and providing contact to the first semiconductor material, wherein the first and second contacts are on opposing sides of the ferroelectric material.

8. The ferroelectric semiconductor device of claim 7, wherein the first semiconductor material has an N-type conductivity and the second semiconductor material has a P-type conductivity.

9. The ferroelectric semiconductor device of claim 7, wherein the first semiconductor material has a P-type conductivity and the second semiconductor material has an N-type conductivity.

10. A ferroelectric semiconductor device, comprising:

a semiconductor substrate having first, second, and third layers, wherein the second layer is a ferroelectric material;

a ferroelectric layer formed over a portion of the third layer of the semiconductor substrate;

a conductive material formed over the ferroelectric layer, the conductive material having first and second edges; and a source region formed in the third layer of the semiconductor substrate and spaced apart from the first edge of the conductive material; and a drain region formed in the third layer of the semiconductor substrate and spaced apart from the second edge of the conductive material, wherein the source region and the drain region are on opposing sides of the conductive material.

11. The ferroelectric semiconductor device of claim 10, further comprising first and second contacts, wherein the first contact is to the source region and the second contact is to the drain region.

* * * * *